US009666356B2

(12) United States Patent
Kato et al.

(10) Patent No.: US 9,666,356 B2
(45) Date of Patent: May 30, 2017

(54) LAMINATED COMMON-MODE CHOKE COIL

(71) Applicant: Murata Manufacturing Co., Ltd., Nagaokakyo-shi, Kyoto-fu (JP)

(72) Inventors: Noboru Kato, Nagaokakyo (JP); Takashi Noma, Nagaokakyo (JP); Hisashi Akiyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/970,614

(22) Filed: Dec. 16, 2015

(65) Prior Publication Data

US 2016/0104569 A1 Apr. 14, 2016

Related U.S. Application Data

(63) Continuation of application No. 14/314,130, filed on Jun. 25, 2014, now Pat. No. 9,245,681, which is a (Continued)

(30) Foreign Application Priority Data

Dec. 27, 2011 (JP) .................................. 2011-284712

(51) Int. Cl.
*H01F 27/28* (2006.01)
*H01F 5/00* (2006.01)
(Continued)

(52) U.S. Cl.
CPC ....... *H01F 27/343* (2013.01); *H01F 17/0013* (2013.01); *H01F 17/0033* (2013.01);
(Continued)

(58) Field of Classification Search
CPC ............. H01F 17/0013; H01F 17/0033; H01F 17/0093; H01F 27/292; H01F 27/343;
(Continued)

(56) References Cited

U.S. PATENT DOCUMENTS

| 2003/0134612 | A1* | 7/2003 | Nakayama | .......... | H01F 17/0013 455/307 |
| 2006/0238273 | A1* | 10/2006 | Tomonari | ............ | H01F 17/0013 333/185 |
| 2011/0007439 | A1* | 1/2011 | Asakawa | ............ | H01F 17/0006 361/56 |

OTHER PUBLICATIONS

Kato et al., "Laminated Common-Mode Choke Coil", U.S. Appl. No. 14/314,130, filed Jun. 25, 2014.

* cited by examiner

*Primary Examiner* — Mangtin Lian
(74) *Attorney, Agent, or Firm* — Keating & Bennett, LLP

(57) ABSTRACT

In a common-mode choke coil, first annular conductors are helically defined from the lower layer to the upper layer, and first annular conductors are helically defined from the upper layer to the lower layer. Further, second annular conductors are helically defined from the lower layer to the upper layer, and second annular conductors are helically defined from the upper layer to the lower layer. The first annular conductors and the second annular conductors are disposed alternately in a lamination direction. The first annular conductors and the second annular conductors are disposed such that substantial portions of the annular conductors adjacent to each other in the layer direction do not overlap in a planar view. This structure achieves a compact common-mode choke coil with which the loss of normal-mode signals is small, and which is highly capable of removing common-mode noise.

4 Claims, 17 Drawing Sheets

Related U.S. Application Data continuation of application No. PCT/JP2012/081452, filed on Dec. 5, 2012.

(51) Int. Cl.
*H01F 27/34* (2006.01)
*H03H 7/42* (2006.01)
*H01F 17/00* (2006.01)
*H02H 9/04* (2006.01)
*H01F 27/29* (2006.01)
*H03H 7/01* (2006.01)
*H03H 1/00* (2006.01)

(52) U.S. Cl.
CPC ....... H01F 27/2804 (2013.01); H01F 27/292 (2013.01); H02H 9/04 (2013.01); H03H 7/427 (2013.01); *H01F 2017/0093* (2013.01); *H01F 2027/2809* (2013.01); *H01F 2027/348* (2013.01); *H03H 7/0107* (2013.01); *H03H 2001/0085* (2013.01)

(58) Field of Classification Search
CPC ......... H01F 27/2804; H01F 2027/2809; H01F 2027/348; H03H 7/427; H03H 7/0107; H03H 2001/0085; H02H 9/04
USPC .......................... 336/200, 223, 222, 232, 105
See application file for complete search history.

Fig.1
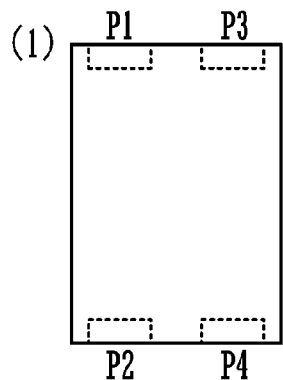
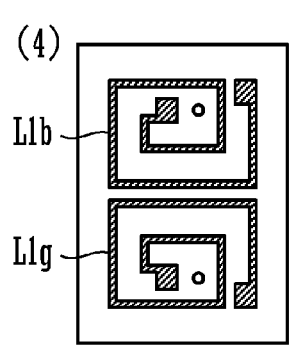
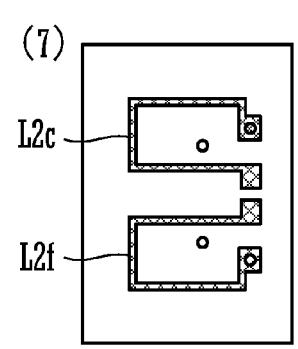
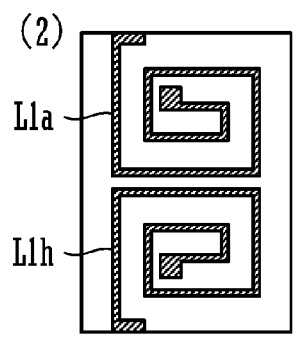
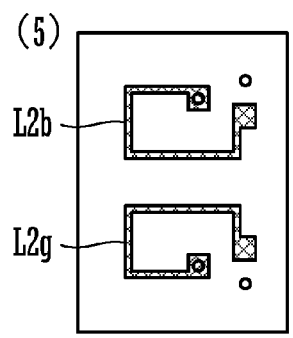
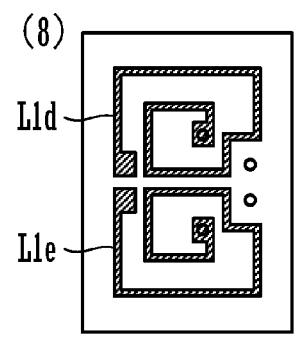
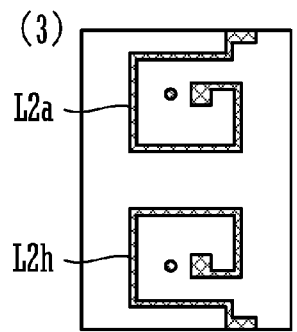
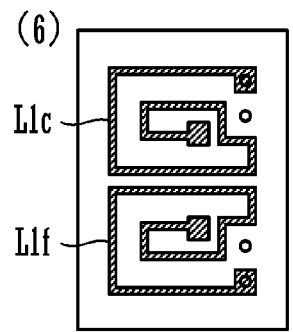
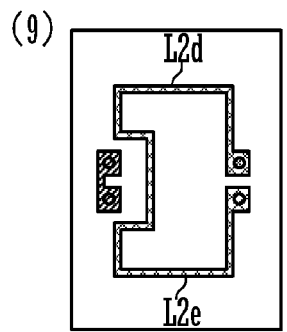

LAMINATED COMMON-MODE CHOKE COIL

BACKGROUND OF THE INVENTION

1. Field of the Invention

The present invention relates to a laminated common-mode choke coil applied to a transmission line of high-frequency signals.

2. Description of the Related Art

For example, with a high-speed interface such as the USB (Universal Serial Bus) and the HDMI (High Definition Multimedia Interface), "the differential transmission scheme" in which signals that are 180° out of phase with each other are respectively transmitted through a pair of signal lines (=balanced line) is used. Since radiated noise and external noise are canceled out at the balanced line with the differential transmission scheme, such kinds of noises are less influential. However, practically speaking, particularly with a signal line for a high-speed interface, common-mode noise current attributed to asymmetry of the signal line occurs. Accordingly, in order to suppress the common-mode noise, a common-mode choke coil is used for a high-speed interface-purpose signal line.

Normally, as disclosed in FIG. 1 of JP 2003-068528 A and FIG. 2 of JP 2008-098625 A, the common-mode choke coil is defined as a small laminated chip component which has two coils (a primary coil and a secondary coil) wound in the identical direction. Here, the primary coil and the secondary coil are aligned in the laminated direction in a lamination element.

FIG. 13 is a cross-sectional view of a common-mode choke coil disclosed in JP 2003-068528 A. This common-mode choke coil is defined to have two coils (laminated coils) 2 and 3 in a lamination element 1. The coils 2 and 3 are wound coaxially and spaced away from each other in the axial direction. The leading ends and trailing ends of the coils 2 and 3 are lead out at the end surfaces on the opposite sides of the lamination element 1, and connected to prescribed external electrodes.

However, it is difficult to increase the degree of coupling between the primary coil and the secondary coil just by aligning the primary coil and the secondary coil simply in the laminated direction in the lamination element. When the degree of coupling between the primary coil and the secondary coil is low, the insertion loss of the normal-mode signals is disadvantageously increased. On the other hand, when the primary coil and the secondary coil are closely disposed to each other in order to increase the degree of coupling, the capacitance occurring between the primary coil and the secondary coil (stray capacitance) is disadvantageously increased. When this capacitance becomes great, the differential impedance of the common-mode choke coil is reduced, thus failing to match with the impedance of the balanced line.

Further, with the structure in which the primary coil and the secondary coil are aligned in the laminated direction in the lamination element, misalignment of the formation position of coil patterns or misalignment in laminating the sheets occurs as a problem in the process. Further, when the common-mode choke is mounted on a printed circuit board, the balance between the capacitance between the primary coil and the ground conductor and the capacitance between the secondary coil and the ground conductor is lost because of problems in the structure such as a difference between the coils in the coupling amount with the ground conductor on the printed circuit board. This makes it impossible to secure symmetry between the primary coil and the secondary coil, and common-mode noise is converted into normal-mode signals. That is, the capability of removing common-mode noise is disadvantageously reduced.

Further, in some cases, a magnetic substance is used as the lamination element. However, since the magnetic substance has relatively great frequency dependence, the loss of normal-mode signals particularly at high frequency bands tends to become great. Further, a full coupling value cannot be obtained between the primary coil and the secondary coil particularly at high frequency bands, and the loss of normal-mode signals tends to become great.

SUMMARY OF THE INVENTION

Preferred embodiments of the present invention provide a compact common-mode choke coil with which loss of normal-mode signals is small, and which is highly capable of removing common-mode noise.

A common-mode choke coil according to a preferred embodiment of the present invention includes a lamination element including a plurality of base layers laminated on each other in a lamination direction, and a primary coil and a secondary coil that are provided in the lamination element and coupled to each other, wherein the primary coil includes first annular conductors provided on the plurality of base layers and an interlayer connection conductor connecting the first annular conductors to each other through the layers, the primary coil being helically defined by the plurality of first annular conductors and the interlayer connection conductor, the secondary coil includes second annular conductors provided on the plurality of base layers and an interlayer connection conductor connecting the second annular conductors to each other through the layers, the secondary coil being helically defined by the plurality of second annular conductors and the interlayer connection conductor, and a total length of a portion where the first annular conductors face the second annular conductors is less than or equal to a half-length of the first annular conductors or second annular conductors.

According to various preferred embodiments of the present invention, the degree of coupling between the primary coil and the secondary coil is significantly increased without causing an increase in stray capacitance between the primary coil and the secondary coil. Hence, a compact common-mode choke coil with which the loss of normal-mode signals is small particularly at high frequency bands, and with which common-mode noise is not prone to be converted to normal-mode signals is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an exploded plan view showing conductor patterns and the like of the layers of a common-mode choke coil according to a first preferred embodiment of the present invention.

DETAILED DESCRIPTION OF THE PREFERRED EMBODIMENTS

First Preferred Embodiment

Figure 2:
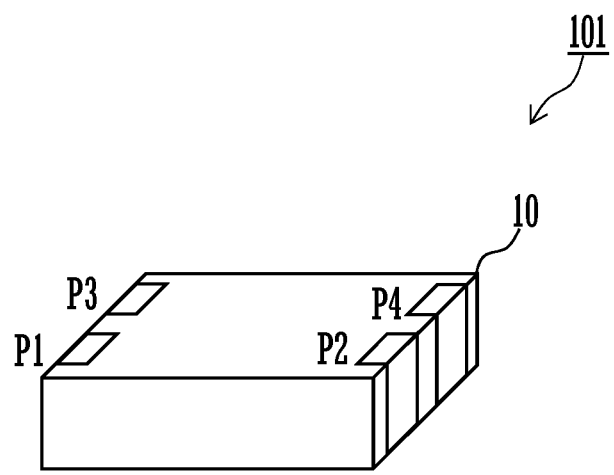
FIG. 2 is an external perspective view of the common-mode choke coil 101 according to the first preferred embodiment of the present invention.

FIG. 1 is an exploded plan view showing conductor patterns and the like of the layers of a common-mode choke coil according to a first preferred embodiment of the present invention. FIG. 2 is an external perspective view of the common-mode choke coil 101 according to the first preferred embodiment.

The common-mode choke coil 101 is a laminated common-mode choke coil including a lamination element 10, which is made up of a plurality of base layers including base layers denoted by (1) to (9) in FIG. 1 being laminated on each other, and a primary coil and a secondary coil which are provided in the lamination element and coupled to each other.

In FIG. 1, the layer (1) is the lowermost layer, and the layer (9) is the uppermost layer. As shown in FIG. 1, electrodes of input/output terminals P1 to P4 are provided on the base layer (1). First annular conductors are provided on the base layers (2), (4), (6), and (8). Second annular conductors are provided on the base layers (3), (5), (7), and (9). The circular patterns shown in FIG. 1 are each a via-hole conductor (interlayer connection conductor). At one end or both the ends of each annular conductor, a connection portion (pad portion) to the via-hole conductor is provided. This structure allows the annular conductors that are adjacent to each other in the layer direction to be connected to each other through the layers.

The primary coil is defined by the first annular conductors L1a, L1b, L1c, L1d, L1e, L1f, L1g, and L1h and the via-hole conductors that connect them. Further, the secondary coil is defined by the second annular conductors L2a, L2b, L2c, L2d, L2e, L2f, L2g, and L2h and the via-hole conductors that connect them.

In FIG. 1, an end of the first annular conductor L1a is connected to the input/output terminal P1, and an end of the first annular conductor L1h is connected to the input/output terminal P2. Further, an end of the second annular conductor L2a is connected to the input/output terminal P3, and an end of the second annular conductor L2h is connected to the input/output terminal P4.

As shown in FIG. 2, the input/output terminals P1, P2, P3, and P4 are provided on the outer surface of the lamination element 10.

In connection with the material of the base layers, in the case where a common-mode choke coil for the HF band is to be provided, since the eddy current loss is relatively small, a magnetic material (a dielectric material with high permeability) preferably is used in view of the capability of confining magnetic energy. On the other hand, for example in the case where a common-mode choke coil for the UHF band is to be provided, in order to suppress the eddy current loss at a high-frequency region, it is preferable to use a dielectric material having high electrical insulation resistance as the material of the base layers. Since permeability of a magnetic substance represented by ferrite is dependent on frequency, the loss becomes disadvantageously greater as the operating frequency band is higher. In contrast, since the frequency dependence of a dielectric material is relatively small, a laminated common-mode choke coil with which loss is small over wide frequency band preferably is implemented. That is, as to a common-mode choke coil used as a high-speed interface supporting wide frequency band, particularly including the high frequency band, it is preferable to use dielectric layers being non-magnetic layers as the base layers.

The base layers preferably are dielectric ceramic layers such as low temperature co-fired ceramics (LTCC), or resin layers made of thermoplastic resin or thermosetting resin, for example. That is, the lamination element may be a ceramic lamination product or a resin lamination product, for example. Further, the annular conductors and the interlayer connection conductors defining the coils, the surface conductors provided on the surface of the lamination element and the like are preferably made of a metallic material whose main component is metal having a small specific resistance, such as copper or silver.

Figure 3A:
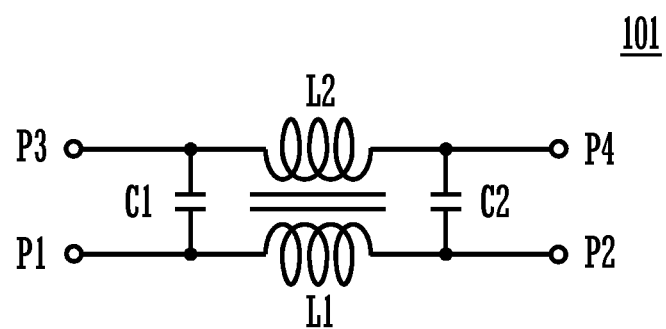
FIGS. 3A and 3B are each an equivalent circuit diagram of the common-mode choke coil 101.
Figure 3B:
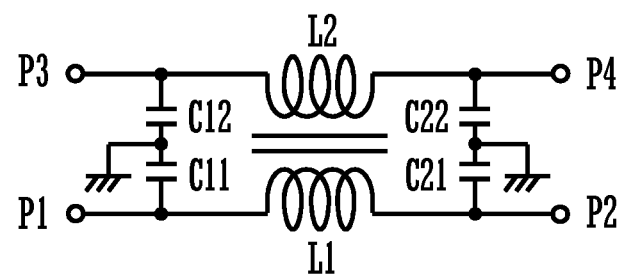

FIGS. 3A and 3B are each an equivalent circuit diagram of the common-mode choke coil 101. The primary coil L1 is defined by the first annular conductors L1a, L1b, L1c, L1d, L1e, L1f, L1g, and L1h and the via-hole conductors that connect them, and the secondary coil L2 is defined by the second annular conductors L2a, L2b, L2c, L2d, L2e, L2f, L2g, and L2h and the via-hole conductors that connect them. As will be detailed later, strong magnetic field coupling is established between the primary coil L1 and the secondary coil L2 as common-mode current flows. Further, stray capacitance occurs between the primary coil L1 and the secondary coil L2. FIG. 3A shows this stray capacitance as capacitors C1 and C2, as a lumped constant circuit. The equivalent circuit of the common-mode choke coil 101 can be also expressed as FIG. 3B. In FIG. 3B, the stray capacitance is represented by capacitors C11, C12, C21, and C22.

Figure 4:
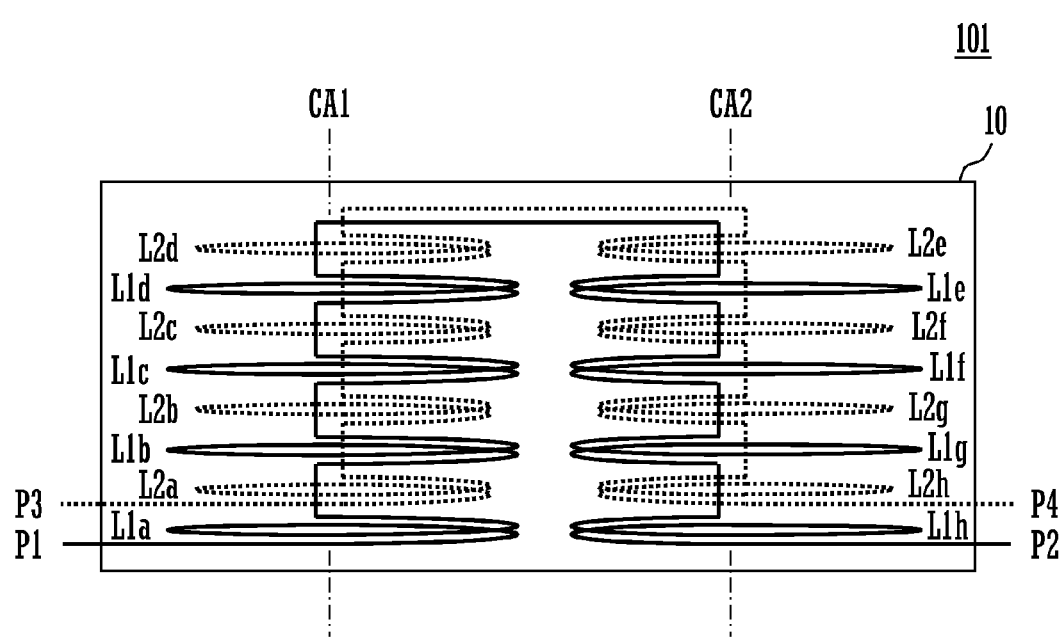
FIG. 4 is a schematic view showing the positional relationship of a primary coil and a secondary coil of the common-mode choke coil 101.

FIG. 4 is a schematic view showing the positional relationship of the primary coil and the secondary coil of the common-mode choke coil 101. The first annular conductors L1a, L1b, L1c, and L1d are disposed from the lower layer to the upper layer in order, to define a helical shape. The first annular conductors L1e, L1f, L1g, and L1h are disposed from the upper layer to the lower layer in order, to define a helical shape. Further, the second annular conductors L2a, L2b, L2c, and L2d are disposed from the lower layer to the upper layer in order, to define a helical shape. The second annular conductors L2e, L2f, L2g, and L2h are disposed from the upper layer to the lower layer in order, to define a helical shape.

The first annular conductors L1a, L1b, L1c, and L1d and the second annular conductors L2a, L2b, L2c, and L2d are alternately disposed in the laminated direction. Similarly, the first annular conductors L1e, L1f, L1g, and L1h and the second annular conductors L2e, L2f, L2g, and L2h are alternately disposed in the laminated direction.

Further, the first annular conductors L1a, L1b, L1c, and L1d are disposed such that their respective centers are aligned along a coil axis CA1. The first annular conductors L1e, L1f, L1g, and L1h are disposed such that their respective centers are aligned along the other coil axis CA2. Further, the second annular conductors L2a, L2b, L2c, and L2d are disposed such that their respective centers are aligned on the coil axis CA1. The second annular conductors L2e, L2f, L2g, and L2h are disposed such that their respective centers are aligned on the other coil axis CA2.

In the example shown in FIG. 4, while the coil axis of the first annular conductors L1a, L1b, L1c, and L1d coincides with the coil axis of the second annular conductors L2a, L2b, L2c, and L2d, and the coil axis of the first annular conductors L1e, L1f, L1g, and L1h coincides with the coil axis of the second annular conductors L2e, L2f, L2g, and L2h, the coil axis of the first annular conductor and the coil axis of the second annular conductor may be displaced from each other to some extent. For example, the coil axis of the first annular conductors L1a, L1b, L1c, and L1d and the coil axis of the second annular conductors L2a, L2b, L2c, and L2d are just required to be located in the range where the annular conductors are located in a planar view. Similarly, the coil axis of the first annular conductors L1e, L1f, L1g, and L1h and the coil axis of the second annular conductors L2e, L2f, L2g, and L2h are just required to be located in the range where the annular conductors are located in a planar view.

With the common-mode choke coil 101, since the primary coil and the secondary coil are in a so-called "bifilar wound" state, the degree of coupling between the primary coil and the secondary coil is high. Accordingly, the insertion loss of the normal-mode signals is small.

The first annular conductors L1a, L1b, L1c, and L1d and the second annular conductors L2a, L2b, L2c, and L2d are the annular conductors located adjacent to each other in the layer direction, and disposed such that their respective substantial portions do not overlap in a planar view. Similarly, the first annular conductors L1e, L1f, L1g, and L1h and the second annular conductors L2e, L2f, L2g, and L2h are annular conductors located adjacent to each other in the layer direction, and disposed such that their respective substantial portions do not overlap in a planar view. In short, as shown by the double-headed arrows in FIG. 14, a total length of a portion where the first annular conductors face the second annular conductors preferably is less than or equal to a half-length of the first annular conductors or second annular conductors. In the first preferred embodiment, the first annular conductors L1a, L1b, L1c, and L1d and the second annular conductors L2a, L2b, L2c, and L2d preferably are disposed such that the parallel portions thereof do not overlap in a planar view. Similarly, the first annular conductors L1e, L1f, L1g, and L1h and the second annular conductors L2e, L2f, L2g, and L2h preferably are disposed such that the parallel portions do not overlap in a planar view.

The substantial portion of each of the annular conductors refers to the substantially entire annular conductor except for the connection portion (the pad portion). However, the first annular conductors and the second annular conductors may partially overlap in a planar view, for example, at portions where the first annular conductors and the second annular conductors cross each other.

Figure 5A:
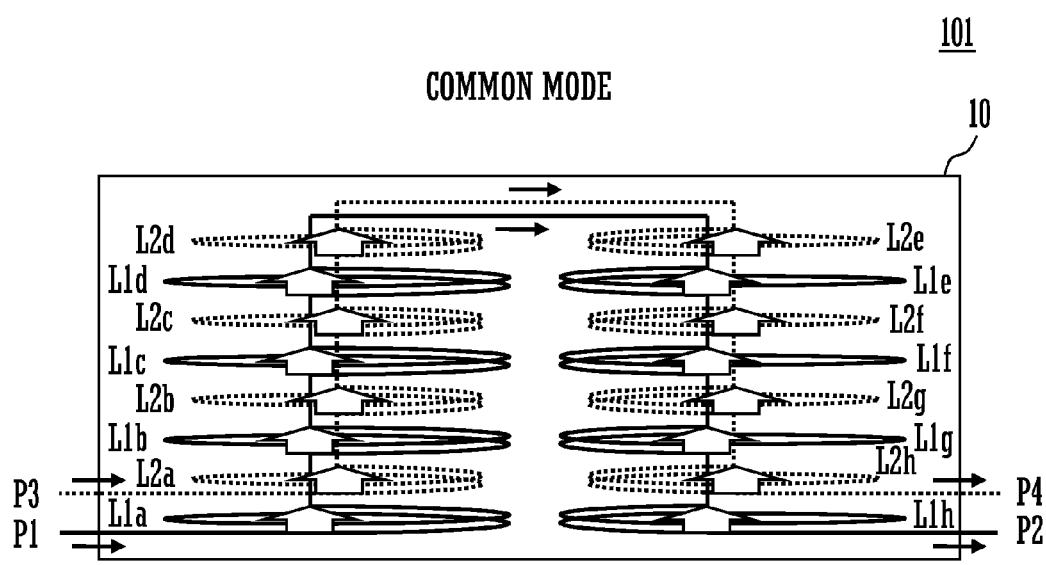
FIG. 5A is a view showing the direction of common-mode noise current and magnetic flux in the common-mode choke coil 101.
Figure 5B:
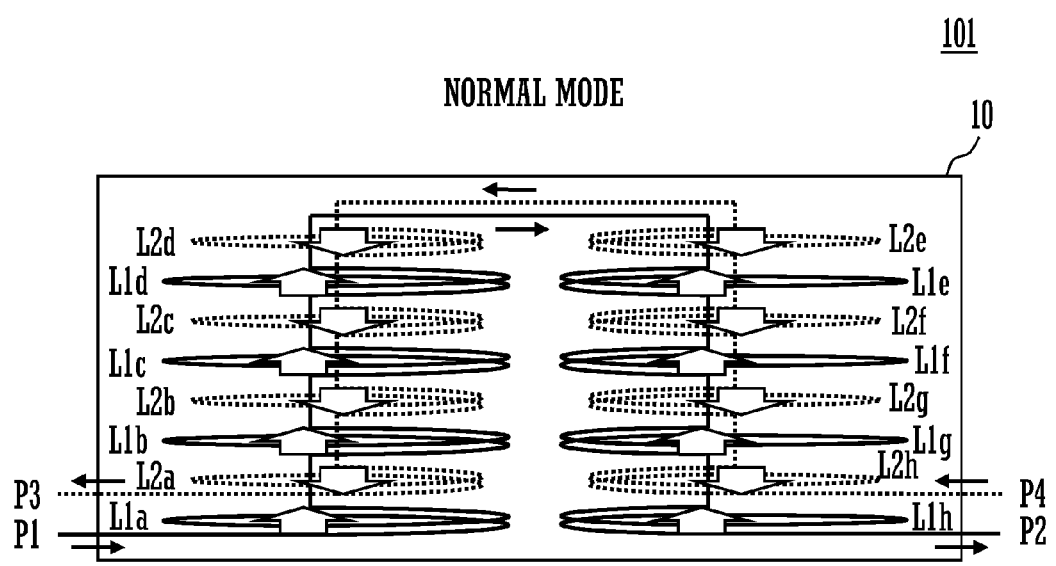
FIG. 5B is a view showing the direction of normal-mode (differential-mode) signal current and magnetic flux in the common-mode choke coil 101.

FIG. 5A is a view showing the direction of common-mode noise current and magnetic flux in the common-mode choke coil 101. FIG. 5B is a view showing the direction of normal-mode (differential-mode) signal current and magnetic flux in the common-mode choke coil 101.

As shown in FIG. 5A, when common-mode current flows, the direction of magnetic flux occurring in the primary coil defined by the first annular conductors L1a, L1b, L1c, and L1d (the half of the primary coil) and the direction of magnetic flux occurring in the secondary coil defined by the second annular conductors L2a, L2b, L2c, and L2d (the half of the secondary coil) agree with each other. Accordingly, the primary coil and the secondary coil mutually enhance the magnetic field. Further, the direction of magnetic flux occurring in the primary coil defined by the first annular conductors L1e, L1f, L1g, and L1h (the half of the primary coil) and the direction of magnetic flux occurring in the secondary coil defined by the second annular conductors L2e, L2f, L2g, and L2h (the half of the secondary coil) agree with each other. Accordingly, the primary coil and the secondary coil mutually enhance the magnetic field. In this manner, the common-mode choke coil 101 defines and functions as an inductor of a great inductance value to the common-mode current. Therefore, the impedance of the common-mode choke coil 101 as seen from the input/output terminals P1 and P3 is high, and the common-mode current (common-mode noise) is suppressed.

As shown in FIG. 5B, when normal-mode current flows, the direction of magnetic flux occurring in the primary coil defined by the first annular conductors L1a, L1b, L1c, and L1d (the half of the primary coil) and the direction of magnetic flux occurring in the secondary coil defined by the second annular conductors L2a, L2b, L2c, and L2d (the half of the secondary coil) are opposite to each other. Accordingly, the primary coil and the secondary coil mutually weaken the magnetic field. Further, the direction of magnetic flux occurring in the primary coil defined by the first annular conductors L1e, L1f, L1g, and L1h (the half of the primary coil) and the direction of magnetic flux occurring in the secondary coil defined by the second annular conductors L2e, L2f, L2g, and L2h (the half of the secondary coil) are opposite to each other. Accordingly, to signals of the normal mode (the differential mode), the primary coil and the secondary coil mutually weaken the magnetic field, and the inductance value of the primary coil L1 and the secondary coil L2 is small. Accordingly, the normal-mode signals are transmitted with a small loss.

In various preferred embodiments of the present invention, the primary coil L1 and the secondary coil L2 are strongly coupled to each other without the use of a magnetic substance such as ferrite for the base layers. Therefore, use of a dielectric for the base layers prevents an increase in the loss of normal-mode signals particularly in a high frequency band.

Figure 14:
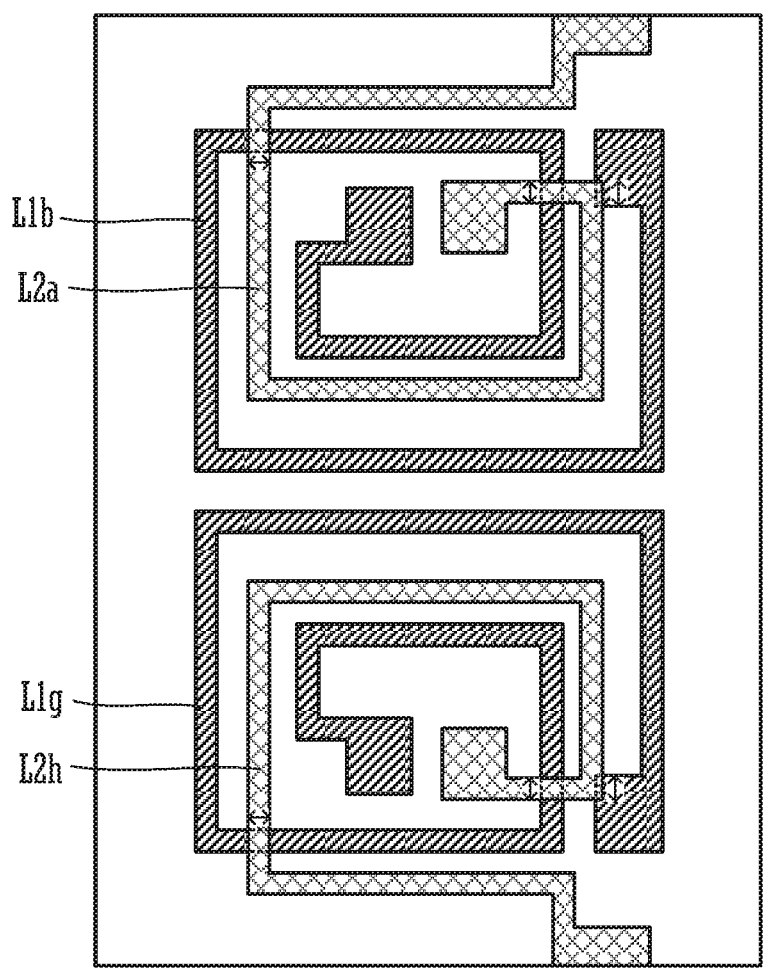
FIG. 14 is a plan view showing conductor patterns of two of the layers of a common-mode choke coil according to the first preferred embodiment of the present invention.

Further, in various preferred embodiments of the present invention, as shown by the double-headed arrows in FIG. 14, a total length of a portion where the first annular conductors face the second annular conductors preferably is less than or equal to a half-length of the first annular conductors or second annular conductors. Therefore, the stray capacitance occurring between the primary coil L1 and the secondary coil L2 is small. That is, even when the interlayer distance between the first annular conductors defining the primary coil and the second annular conductors defining the secondary coil is reduced in order to enhance the magnetic field coupling between the primary coil L1 and the secondary coil L2, the stray capacitance occurring between the primary coil L1 and the secondary coil L2 is not increased. Therefore, the differential impedance of the common-mode choke coil is secured properly, and is matched to the impedance of the balanced line. In particular, when the first annular conductors and the second annular conductors are disposed such that their respective substantial portions do not overlap in a planar view, the stray capacitance becomes further smaller; the differential impedance of the common-mode choke coil is secured more properly; and matching to the impedance of the balanced line is further facilitated.

Further, in various preferred embodiments of the present invention, since the base layers each provided with the second annular conductor are positioned between the base layers each provided with the first annular conductor, the interval between the first annular conductors becomes great. Similarly, since the base layers each provided with the first annular conductor are positioned between the base layers each provided with the second annular conductor, the interval between the second annular conductors becomes great. Accordingly, both the interlayer capacitance in the first annular conductor and the interlayer capacitance in the second annular conductor are small. Hence, the self-resonant frequency (cutoff frequency) based on such interlayer capacitance and the inductance of the primary coil and the secondary coil is shifted toward the higher frequency side, and an excellent pass characteristic is secured over wide frequency band.

In the first preferred embodiment, the capacitance occurring between the ground conductor located on the printed circuit board on which the common-mode choke coil is mounted and the first annular conductors L1a to L1h is equal or substantially equal to the capacitance occurring between the ground conductor and the second annular conductors L2a to L2h. Thus, symmetry between the primary coil and the secondary coil is secured. That is, the value of the capacitors C11, C12, C21, and C22 shown in FIG. 3B preferably have the following relationship: C11≈C21, C12≈C22. Accordingly, there is little occurrence of conversion from the common-mode noise to the normal-mode signals (noise) attributed to imbalance of the capacitance.

In particular, in the first preferred embodiment, the common-mode choke coil 101 includes a group of annular conductors including a plurality of first annular conductors L1a, L1b, L1c, and L1d and a plurality of second annular conductors L2a, L2b, L2c, and L2d which are disposed such that their respective coil axes are aligned along an identical axis, and a group of annular conductors including a plurality of first annular conductors L1e, L1f, L1g, and L1h and a plurality of second annular conductors L2e, L2f, L2g, and L2h which are disposed such that their respective coil axes are aligned along an identical axis. These two groups of annular conductors are disposed such that the first annular conductors are connected in series and the second annular conductors are connected in series, and that symmetry between them in a planar view in the laminated direction of the base layers is maintained. Therefore, symmetry of the circuitry between the input/output terminals P1-P3 and the input/output terminals P2-P4 including the stray component is high. Accordingly, the above-described conversion from the common-mode noise to the normal-mode signals (noise) is further suppressed.

Further, the values of the capacitors C11, C12, C21, and C22 also preferably have the relationship of C11≈C12, C21≈C22. Therefore, the line impedance between the input/output terminals P1 and P2 and the line impedance between the input/output terminals P3 and P4 are equal or substantially equal to each other, and there is little reflection of the normal-mode signals in the common-mode choke coil 101.

Further, in the first preferred embodiment, in both the primary coil defined by the first annular conductors L1a to L1h and the secondary coil defined by the second annular conductors L2a to L2h, the annular conductor L1a, L1h, L2a, and L2h on the side nearer to the input/output terminals face the ground conductor located on the printed circuit board on which the common-mode choke coil is mounted. Therefore, there is little unnecessary wiring in the lamination element, such that unnecessary stray capacitance is eliminated.

Note that, in the first preferred embodiment, the example in which a group of annular conductors including a plurality of first annular conductors L1a, L1b, L1c, and L1d and a plurality of second annular conductors L2a, L2b, L2c, and L2d which are disposed such that their respective coil axes are aligned along an identical axis and a group of annular conductors including a plurality of first annular conductors L1e, L1f, L1g, and L1h and a plurality of second annular conductors L2e, L2f, L2g, and L2h which are disposed such that their respective coil axes are aligned along an identical axis has been shown. However, it is also possible that four or more groups of annular conductors are connected in series, and that the groups of annular conductors are disposed so as to substantially maintain symmetry to one another in a planar view in the laminated direction of the base layers.

Second Preferred Embodiment

Figure 6:
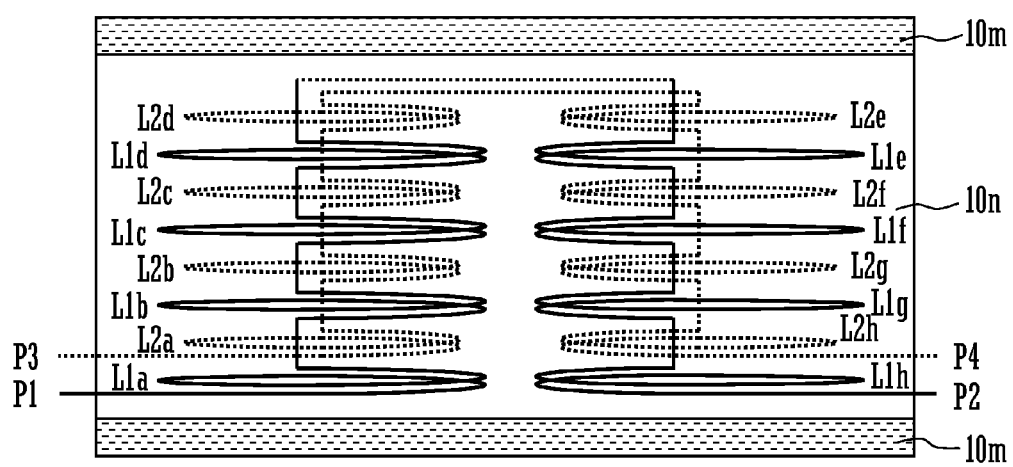
FIG. 6 is a schematic cross-sectional view of a common-mode choke coil 102 according to a second preferred embodiment of the present invention.

FIG. 6 is a schematic cross-sectional view of a common-mode choke coil 102 according to a second preferred embodiment of the present invention. In this common-mode choke coil 102, the outermost layers are each defined by a magnetic layer 10m, and the first annular conductors L1a to L1h and the second annular conductors L2a to L2h are provided on a non-magnetic layer (a low-permeability layer, a dielectric layer) 10n. The non-magnetic layer 10n and the annular conductors preferably have the structure identical to that of the common-mode choke coil 101 according to the first preferred embodiment. The relative permeability μr of the non-magnetic layer 10n is 1, and the relative permeability μr of the magnetic layer 10m is about 200 to 500, for example.

Since the magnetic field shown in FIG. 5A is generated by common-mode current, magnetic flux passes through the magnetic layers 10m. Accordingly, the inductance value becomes further greater effectively to common-mode noise. Further, the magnetic layers 10m also function as the magnetic shield, preventing entry of magnetic field noise from the outside and leakage of a magnetic field generated by common-mode noise to the outside. To normal-mode current, since the magnetic field generated by the primary coil and the magnetic field generated by the secondary coil cancel out mutually as shown in FIG. 5B, there is no influence of the magnetic layers 10m.

Third Preferred Embodiment

Figure 7:
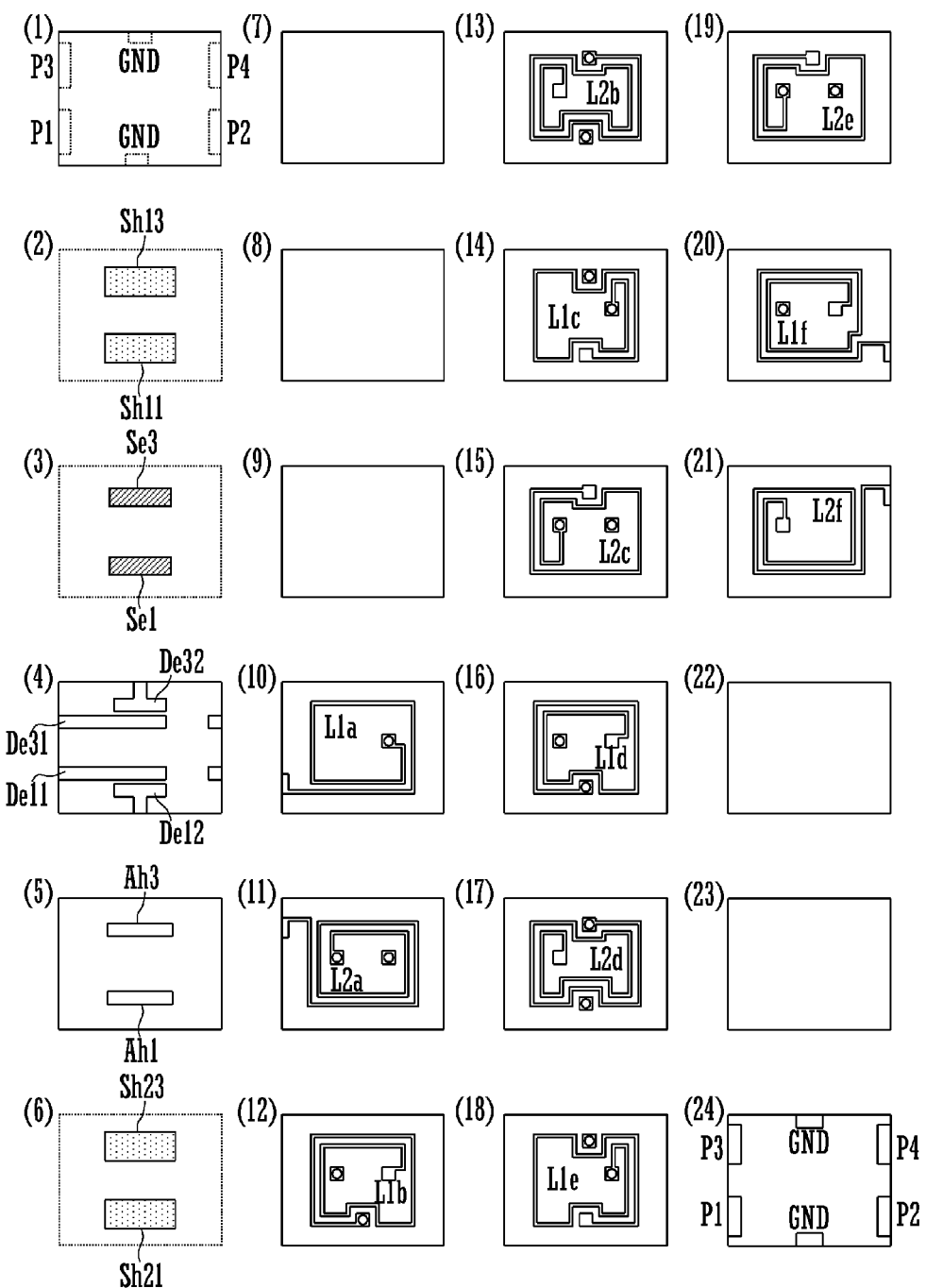
FIG. 7 is an exploded plan view showing conductor patterns and the like of the layers of a common-mode choke coil according to a third preferred embodiment of the present invention.
Figure 8:
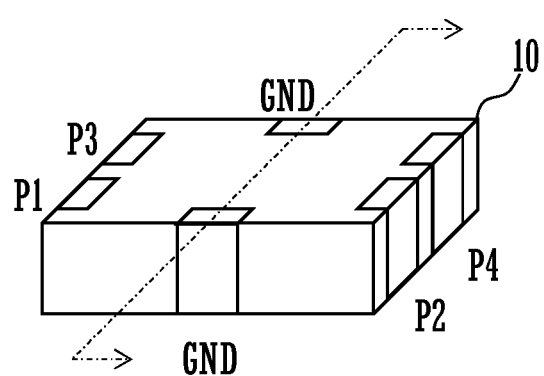
FIG. 8 is an external perspective view of the common-mode choke coil 103 according to the third preferred embodiment of the present invention.
Figure 9A:
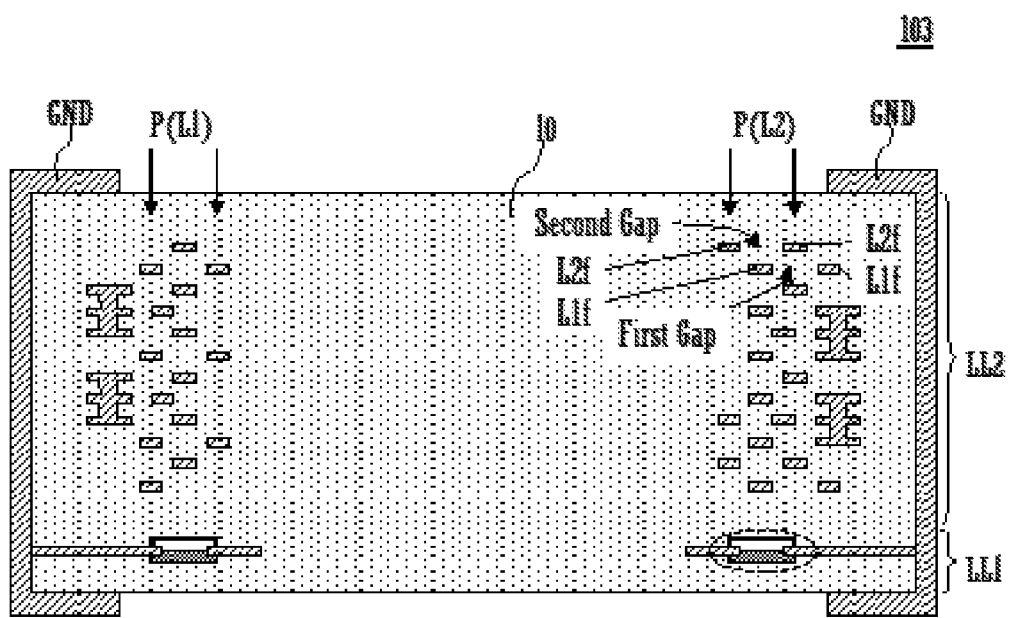
FIG. 9A is a cross-sectional view of the common-mode choke coil 103.
Figure 9B:
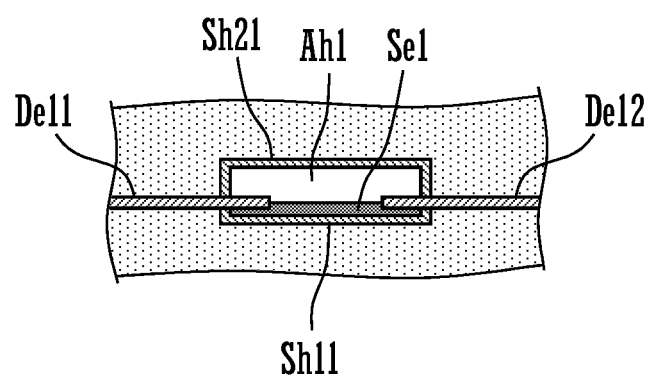
FIG. 9B is a cross-sectional view of an ESD protection element portion.

FIG. 7 is an exploded plan view showing conductor patterns and the like of the layers of a common-mode choke coil according to a third preferred embodiment of the present invention. FIG. 8 is an external perspective view of the common-mode choke coil 103 according to the third preferred embodiment. FIG. 9A is a cross-sectional view of the common-mode choke coil 103. FIG. 9B is a cross-sectional view of an ESD protection element portion.

The common-mode choke coil 103 is a laminated common-mode choke coil having a lamination element 10, which includes a plurality of base layers including base layers denoted by (1) to (24) in FIG. 7 being laminated on each other, and a primary coil and a secondary coil which are provided on the lamination element and coupled to each other.

FIG. 7 shows the layers (1) to (24) of the lamination element, and the shape of conductor patterns and the like provided on the layers. The layer (1) is the lowermost layer, and the layer (24) is the uppermost layer. The lower surface (bottom surface) of the lowermost layer (1) is the mounting surface to the wiring board on which the common-mode choke coil is mounted. On the lower surface of the lowermost layer (1), input/output terminals P1, P2, P3, and P4 and ground terminals GND are provided (see FIG. 8). On the 2nd layer (2), shield layers Sh11 and Sh13 are provided. On the 3rd layer (3), discharge auxiliary electrodes Se1 and Se3 are provided. On the 4th layer (4), discharge electrodes De11, De12, De31, and De32 are provided. On the 5th layer (5), hollow layers Ah1 and Ah3 are provided. On the 6th layer (6), shield layers Sh21 and Sh23 are provided. However, the 2nd layer (2) to the 5th layer (5) are not provided on independent green sheets. Instead, they are applied on the upper surface of the lowermost layer (1). The lamination structure of this portion will be detailed later.

The 7th layer (7) to the 9th layer (9) are dielectric layers with no conductor patterns. These layers are provided in order to increase the interval between the common-mode choke coil portion and the ESD protection element portion.

On the 10th layer (10), the 12th layer (12), the 14th layer (14), the 16th layer (16), the 18th layer (18), and the 20th layer (20), first annular conductors L1a, L1b, L1c, L1d, L1e, and L1f are provided, respectively.

On the 11th layer (11), the 13th layer (13), the 15th layer (15), the 17th layer (17), the 19th layer (19), and the 21st layer (21), second annular conductors L2a, L2b, L2c, L2d, L2e, and L2f are provided, respectively.

One end of the first annular conductor L1a is electrically connected to the input/output terminal P1, and one end of the first annular conductor L1f is electrically connected to the input/output terminal P2.

One end of the second annular conductor L2a is electrically connected to the input/output terminal P3, and one end of the second annular conductor L2f is electrically connected to the input/output terminal P4.

The circular patterns shown in FIG. 7 are each a via-hole conductor (interlayer connection conductor). At one end or both the ends of each annular conductor, a connection portion (pad portion) to the via-hole conductor is provided. This structure allows the annular conductors being adjacent to each other in the layer direction to be connected to each other through the layers.

The primary coil is defined by the first annular conductors L1a to L1f and the via-hole conductors that connect them. Further, the secondary coil is defined by the second annular conductors L2a to L2f and the via-hole conductors that connect them.

The 22nd layer (22) and the 23rd layer (23) are dielectric layers with no conductor patterns. These layers are provided for the purpose of keeping the interval between the primary and secondary coils and the mounting surface at a prescribed distance, in the case where the uppermost layer (24) becomes the mounting surface. This interval determines the capacitance occurring between the ground conductor of any device on which the common-mode choke coil is mounted and the primary and secondary coils to a prescribed value.

On the upper surface of the uppermost layer (24), external electrodes are provided as the input/output terminals P1, P2, P3, and P4 and the ground terminals GND.

In FIG. 9A, on a lamination portion LL1, the ESD protection element portion including the shield layers Sh11 and Sh13, the discharge auxiliary electrodes Se1 and Se3, the discharge electrodes De11, De12, De31, and De32, the hollow layers Ah1 and Ah3, and the shield layers Sh21 and Sh23 is provided. On a lamination portion LL2, the annular conductors are provided.

Figure 10:
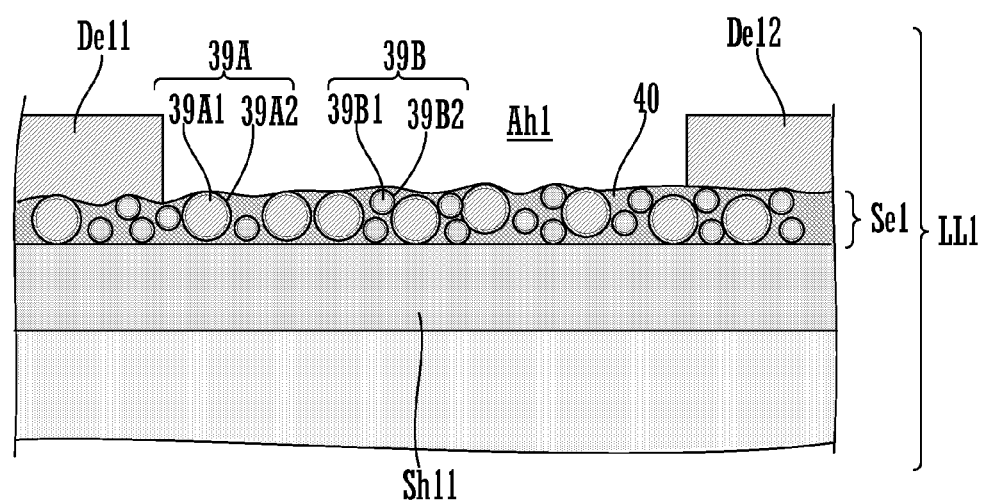
FIG. 10 is a schematic view showing a cross-sectional structure of a portion including discharge electrodes De11 and De12.

FIG. 10 is a schematic view showing the cross-sectional structure of a portion including the discharge electrodes De11 and De12. The cross-sectional structure of a portion including the discharge electrodes De31 and De32 is the same. In this example, the shield layer Sh11 preferably is an insulating ceramic layer. The shield layer Sh11 is provided in order to prevent glass component from leaking from an LTCC green sheet, which is the base, toward the discharge auxiliary electrode Se1 portion, when the LTCC green sheet is integrally fired.

The discharge auxiliary electrode Se1 includes the discharge auxiliary members 39A and 39B. The discharge auxiliary member 39A includes a granular metallic material 39A1 and an insulating coat 39A2 provided on the surface of the metallic material 39A1. Further, the discharge auxiliary electrode Se1 includes a granular semiconductor material 39B1 and an insulating coat 39B2 provided on the surface of the semiconductor material 39B1. Here, the metallic material 39A1 preferably includes Cu grains, and the semiconductor material 39B1 preferably includes SiC grains. Further, the insulating coat 39A2 preferably is an alumina coat, and the insulating coat 39B2 preferably is a $SiO_2$ coat which is generated by oxidation of the semiconductor material 39B1.

Further, on the discharge auxiliary electrode Se1, a glass-like substance 40 is arranged to surround the discharge auxiliary members 39A and 39B. The glass-like substance 40 is not intentionally formed. The glass-like substance 40 is generated by a reaction such as oxidation of any constituent material derived from members relating to a sacrificial layer which is used to form a hollow Ah1.

With the structure shown in FIG. 10, when a high voltage is applied across the discharge electrodes De11-De12, the following occurs: (1) creeping discharge of the discharge auxiliary electrode Se1; (2) air discharge between the discharge electrodes De11 and De12; and (3) discharge that propagates from the discharge auxiliary members 39A to 39B like a skipping stone. Thus, static electricity is discharged.

The common-mode choke coil 103 shown in FIGS. 9A, 9B and 10 is preferably manufactured by the following materials and steps, for example.

The shield layers Sh11, sh13, sh21 and Sh23 on the lamination portion LL1 may be formed by, for example, alumina paste whose main component is alumina powder. Further, an electrode paste used to form the discharge electrodes is obtained by agitating and mixing Cu powder with a binder resin which is made of ethyl cellulose and the like and to which a solvent is added.

The resin paste serving as the origin of the hollows Ah1 and Ah3 is fabricated through the similar method. This resin paste is made of solely resin and a solvent. As the resin material, resin which decomposes and vanishes upon firing is used. The resin material may be, for example, PET, polypropylene, acrylic resin and the like.

The mixture paste for forming the discharge auxiliary electrodes Se1 and Se3 is obtained by blending Cu powder as a conductive material and BAS powder as a ceramic material at a prescribed ratio, and adding a binder resin and a solvent thereto and agitating and mixing the mixture.

The paste for the shield layers Sh11 and Sh13 is applied to a ground green sheet. Thereafter, the electrode paste for the discharge electrodes is applied. The resin paste used to form the hollows Ah1 and Ah3 is applied. Further, the paste for the shield layers Sh21 and Sh23 is applied.

The lamination portion LL2 shown in FIG. 9A is defined by laminating ceramic green sheets and fixing them under pressure, similarly to a normal multilayer ceramic substrate.

The lamination product obtained by joining under pressure is cut by a micro cutter similarly to a chip-type electronic component such as an LC filter, and separated into lamination elements. Thereafter, to the end surfaces of each of the lamination elements, electrode paste that becomes various external terminals after firing is applied.

Subsequently, similarly to a normal multilayer ceramic substrate, each lamination element is fired in an atmosphere of $N_2$, for example. However, in the case where rare gas such as Ar, Ne or the like is introduced to the hollow portions in order to reduce the voltage responding to ESD, the lamination element should be fired at the temperature at which contraction and sintering of the ceramic material take place and in an atmosphere of rare gas such as Ar, Ne and the like. When the discharge electrodes De11, De12, De31, and De32 and the external electrodes are made of an electrode material that is not oxidized, the lamination element may be fired in an atmosphere of air.

Thereafter, similarly to a chip-type electronic component such as an LC filter, a Ni—Sn plating film is formed on the surface of each of the external electrodes by electrolytic Ni—Sn plating.

Meanwhile, in general, it is very difficult to perform firing such that Fe in ferrite is oxidized and such that Cu in the electrode material is not oxidized. Therefore, when ferrite is used in the lamination element, it becomes necessary to use Ag as the electrode material. However, in the case where the discharge electrodes De11, De12, De31, and De32 are formed by Ag, migration appears significantly, and the spark gap varies over time. On the other hand, in various preferred embodiments of the present invention, use of LTCC in the lamination element allows use of Cu as the electrode material. In the case where the discharge electrodes De11, De12, De31, and De32 are made of Cu, a Cu oxide film is formed on the surface of each electrode by the energy of discharge. However, this film does not function as a discharge electrode member. Therefore, the discharge gap is maintained to be substantially constant even when discharge is repeatedly performed.

Figure 11:
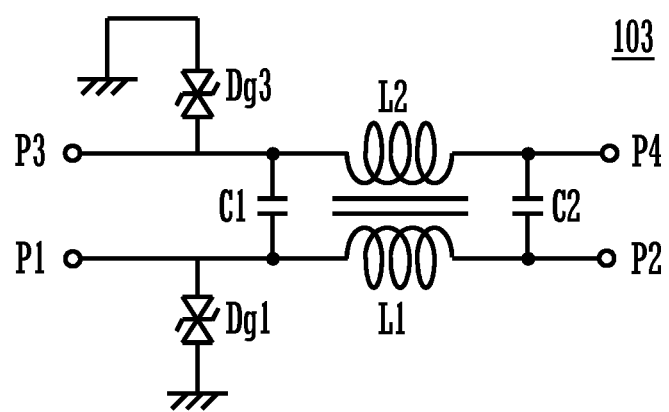
FIG. 11 is an equivalent circuit diagram of the common-mode choke coil 103.

FIG. 11 is an equivalent circuit diagram of the common-mode choke coil 103. With the structure described in the foregoing, the primary coil L1 whose first end is the input/output terminal P1 and second end is the input/output terminal P2, and the secondary coil L2 whose first end is the input/output terminal P3 and second end is the input/output terminal P4 are defined. That is, the primary coil L1 is defined by a series circuit of the annular conductors L1a to L1f. Further, the secondary coil L2 is defined by a series circuit of the annular conductors L2a to L2f.

Between the input/output terminal P1 and the input/output terminal P3, for example, a feeder circuit is connected. Between the input/output terminal P2 and the input/output terminal P4, for example a digital signal processing circuit is connected. Capacitors C1 and C2 in FIG. 11 equivalently represent the stray capacitance between the primary coil L1 and the secondary coil L2.

When static electricity exceeding the voltage protection level is applied to the input/output terminal P1, a discharge element Dg1 defined by the discharge electrodes and the discharge auxiliary electrode discharges (is energized), and the discharge element Dg1 attains low impedance. Thus, the static electricity applied to the input/output terminal P1 is shunt to ground via the discharge element Dg1. Similarly, when static electricity exceeding the voltage protection level is applied to the input/output terminal P3, a discharge element Dg3 is energized, and the discharge element Dg3 attains low impedance. Thus, the static electricity applied to the input/output terminal P3 is shunt to ground via the discharge element Dg3.

As shown in FIG. 11, it is preferable that the discharge elements Dg1 and Dg3 are provided on the static electricity incoming side. In particular, even when the input impedance of the circuitry connected to the input/output terminals P2 and P4 is low, since the common-mode choke coil defined by the primary coil L1 and the secondary coil L2 has high impedance to the surge of high frequency components such as ESD, the surge is reflected at the common-mode choke coil and the high voltage is applied to the discharge elements Dg1 and Dg3. Then, the discharge elements Dg1 and Dg3 quickly attain the discharge voltage and start to discharge. Accordingly, the surge is more surely prevented from flowing into the circuitry connected to the input/output terminals P2 and P4.

In this manner, with the common-mode choke coil 103 according to the third preferred embodiment, since the base layers are non-magnetic layers, the ESD (Electrostatic Discharge) protection elements are easily formed and integrated on the surface or in the inner layers of the lamination element.

Note that, though a nonlinear resistor element such as a varistor can be used as the ESD protection element, such an ESD protection element, by the voltage variable resistor scheme, does not exhibit an excellent responding characteristic. Accordingly, when such an ESD protection element is disposed at the front stage of the primary coil or the secondary coil, this element itself may be destroyed by inrush current. Accordingly, as the ESD protection element, it is preferable to configure an ESD protection element of a so-called inter-electrode discharge scheme (spark gap scheme), i.e., an ESD protection element including a hollow portion provided inside the lamination element and a pair of discharge electrodes provided in the hollow portion.

Note that, based on the disposition of the annular conductors shown in FIG. 7, in the state where the common-mode choke coil 103 is mounted on the printed circuit board, the capacitance occurring between the ground conductor on the printed circuit board and the annular conductors exhibits high symmetry between the primary coil and the secondary coil. Therefore, the relationship in which the phase difference of common-mode noise is 0° is maintained. Accordingly, signal conversion from common-mode noise to normal-mode component incurred by the phase difference does not take place, and hence common-mode noise will not flow in as normal mode (differential mode) signals (noise).

Figure 12:
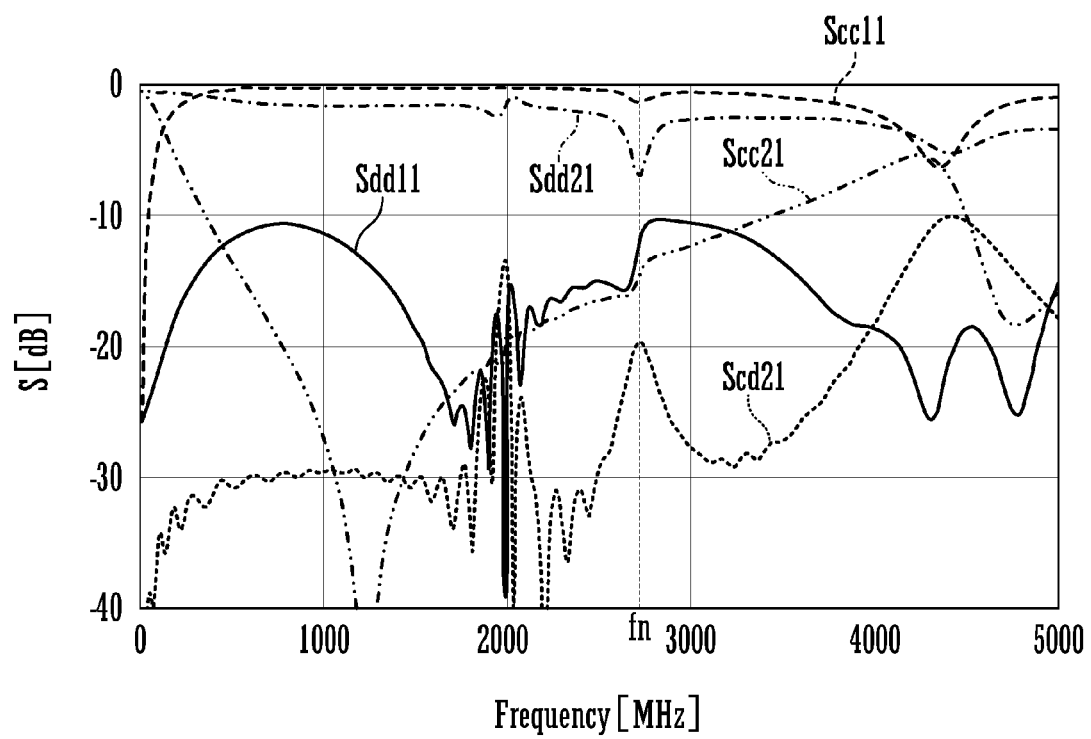
FIG. 12 is a diagram showing the frequency characteristic of the common-mode choke coil according to the third preferred embodiment of the present invention.
Figure 13:
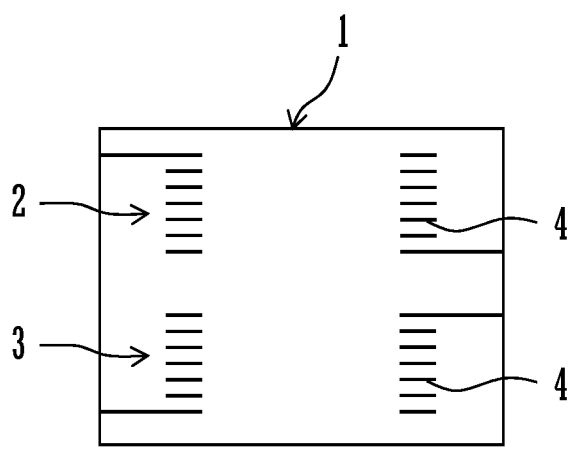
FIG. 13 is a cross-sectional view of a common-mode choke coil disclosed in JP 2003-068528 A.

FIG. 12 is a diagram showing the measured frequency characteristic of the common-mode choke coil according to the third preferred embodiment, in which the planar size of the lamination product preferably is approximately 1.2 mm×1.0 mm, the thickness is about 0.6 mm, and the interval between the layers is about 25 μm, for example. Here, the characteristic curves represent the following.

Sdd11: the reflection characteristic of the normal mode
Sdd21: the pass characteristic of the normal mode
Scc11: the reflection characteristic of the common mode
Scc21: the pass characteristic of the common mode
Scd21: the frequency characteristic of the quantity of the common mode being converted to the normal mode As can be seen from FIG. 12, the reflection characteristic of normal-mode signals Sdd11 achieves a low reflection characteristic as to normal-mode signals over a range of several MHz to 5000 MHz. Further, the reflection characteristic of common-mode noise Scc11 achieves a low reflection characteristic as to common-mode noise at frequencies of tens of MHz or higher. Further, the pass characteristic of the common mode Scc21 achieves a great attenuation characteristic as to common-mode signals at frequencies of hundreds of MHz or higher. This characteristic shows a pole at around 1200 MHz because of self resonance of the inductance occurring with the common mode. Further, the frequency characteristic of the quantity of the common mode being converted to the normal mode Scd21 assumes −10 db or lower at every frequency band, and is fully suppressed. Further, Sdd21 shows a notch at frequency fn, which is a resonance point attributed to the difference in inductance between the primary coil L1 and the secondary coil L2. By setting the resonance frequency as appropriate, it becomes possible to provide the lamination product with a filtering function of attenuating a prescribed frequency of normal-mode signals. Therefore, it is not necessary to provide the lamination product with any elements separately such as a balanced low-pass filter, other than the common-mode choke coil. Thus, a reduction in the number of components is achieved, and thus a reduction in costs is achieved.

Note that, though two ground terminals preferably are provided in the example shown in FIGS. 7 and 8, one common ground terminal may be provided. Further, depending on the use, the ESD protection element may be provided solely between the input/output terminal P2 and the ground, or solely between the input/output terminal P4 and the ground.

Note that, in the foregoing preferred embodiments, the number of turns of the coils and the number of intersections between the primary coil and the secondary coil shown by the structure view of the lamination product are of an exemplary nature, and the number of turns and the number of intersections of the annular conductors are not limited to those shown in the drawings. They should be determined according to a desired characteristic. The number of turns of the primary coil and that of the secondary coil contribute to determining the impedance with the normal mode. Further, the number of intersections between the primary coil and the secondary coil contributes to the degree of coupling between the primary coil and the secondary coil.

In particular, when the number of turns of the annular conductors per layer is one or more, the variations in inductance and degree of coupling attributed to lamination misalignment of the base layers become small. Further, when the number of turns of the annular conductors per layer is three or more, the interlayer capacitance between the first annular conductor and the second annular conductor adjacent to each other between layers tends to increase. Accordingly, the number of turns of the annular conductors per layer is preferably from one to three inclusive, for example.

A common-mode choke coil according to various preferred embodiments of the present invention can be used for a high-speed interface such as the USB or the HDMI, for example. Further, a common-mode choke coil according to various preferred embodiments of the present invention is useful as a filter for a power supply circuit with a high switching frequency (e.g., 1 MHz or higher), or as a filter for a BUS line of a high speed (e.g., a transmission rate of 600 MBit/sec).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A laminated common-mode choke coil comprising:
a lamination element including a plurality of base layers laminated on each other in a lamination direction; and
a primary coil and a secondary coil that are provided in the lamination element and coupled to each other; wherein
the primary coil includes:
first annular conductors provided on the plurality of base layers; and
a first interlayer connection conductor connecting the first annular conductors to each other through the plurality of base layers, the primary coil being helically defined by the first annular conductors and the first interlayer connection conductor;
the secondary coil includes:
second annular conductors provided on the plurality of base layers; and
a second interlayer connection conductor connecting the second annular conductors to each other through the plurality of base layers, the secondary coil being helically defined by the second annular conductors and the second interlayer connection conductor;
a number of turns of the first annular conductors is greater than one and a number of turns of the second annular conductors is greater than one;
the primary coil includes a first gap between linear portions of the first annular conductors that are adjacent to each other;
the secondary coil includes a second gap between linear portions of the second annular conductors that are adjacent to each other;
portions of the second annular conductors and the second gap are located inside the first gap so as to extend along the first gap in a planar view in the lamination direction; and a total length of portions of the first and second annular conductors where the first annular conductors overlap the second annular conductors in the planar view in the lamination direction is less than or equal to a half-length of the first annular conductors or the second annular conductors.

2. The laminated common-mode choke coil according to claim 1, wherein each of the plurality of base layers is a non-magnetic layer.

3. The laminated common-mode choke coil according to claim 2, further comprising:
a first ESD protection element that is connected to the primary coil and a second ESD protection element that is connected to the secondary coil; wherein
the first ESD protection element and the second ESD protection element are provided on one of a surface and an inside of the lamination element.

4. The laminated common-mode choke coil according to claim 3, wherein the first ESD protection element and the second ESD protection element each include a hollow portion that is located on the inside of the lamination element, and a pair of discharge electrodes located in the hollow portion.

* * * * *